(12) United States Patent
Frohberg et al.

(10) Patent No.: US 8,338,284 B2
(45) Date of Patent: Dec. 25, 2012

(54) STRESS ENGINEERING IN A CONTACT LEVEL OF SEMICONDUCTOR DEVICES BY STRESSED CONDUCTIVE LAYERS AND AN ISOLATION SPACER

(75) Inventors: Kai Frohberg, Niederau (DE); Hartmut Ruelke, Dresden (DE); Volker Jaschke, Radebeul (DE); Joerg Hohage, Dresden (DE); Frank Seliger, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 249 days.

(21) Appl. No.: 12/891,301

(22) Filed: Sep. 27, 2010

(65) Prior Publication Data

US 2011/0073959 A1 Mar. 31, 2011

(30) Foreign Application Priority Data

Sep. 30, 2009 (DE) .......................... 10 2009 043 329

(51) Int. Cl.
*H01L 21/3205* (2006.01)
*H01L 21/4763* (2006.01)

(52) U.S. Cl. ........ 438/586; 438/597; 438/639; 438/675; 257/E21.19

(58) Field of Classification Search .................. 438/586, 438/597; 257/E21.19
See application file for complete search history.

(56) References Cited

U.S. PATENT DOCUMENTS

| 4,977,105 | A | * | 12/1990 | Okamoto et al. | ............. 438/639 |
|---|---|---|---|---|---|
| 5,408,130 | A | | 4/1995 | Woo et al. | ...................... 257/758 |
| 6,303,491 | B1 | * | 10/2001 | Tsai et al. | ..................... 438/639 |
| 2006/0113641 | A1 | * | 6/2006 | Hohage et al. | ................ 257/640 |
| 2008/0315321 | A1 | | 12/2008 | Ke et al. | ......................... 257/383 |
| 2010/0327362 | A1 | * | 12/2010 | Richter et al. | ................. 257/368 |

OTHER PUBLICATIONS

Translation of Official Communication from German Patent Office for German Patent Application No. 10 2009 043 329.5-33 dated Nov. 15, 2010.

\* cited by examiner

*Primary Examiner* — Stephen W Smoot
*Assistant Examiner* — Vicki B Booker
(74) *Attorney, Agent, or Firm* — Williams, Morgan & Amerson, P.C.

(57) ABSTRACT

In sophisticated semiconductor devices, strain-inducing materials having a reduced dielectric strength or having certain conductivity, such as metal nitride and the like, may be used in the contact level in order to enhance performance of circuit elements, such as field effect transistors. For this purpose, a strain-inducing material may be efficiently encapsulated on the basis of a dielectric layer stack that may be patterned prior to forming the actual interlayer dielectric material in order to mask sidewall surface areas on the basis of spacer elements.

15 Claims, 8 Drawing Sheets

STRESS ENGINEERING IN A CONTACT LEVEL OF SEMICONDUCTOR DEVICES BY STRESSED CONDUCTIVE LAYERS AND AN ISOLATION SPACER

BACKGROUND OF THE INVENTION

1. Field of the Invention

Generally, the present disclosure relates to the field of integrated circuits, and, more particularly, to circuit elements, such as field effect transistors, and manufacturing techniques based on strain-inducing mechanisms using stressed material layers formed in the contact level.

2. Description of the Related Art

Integrated circuits typically include a large number of circuit elements located on a given chip area according to a specified circuit layout, wherein, in complex circuits, the field effect transistor represents one predominant circuit element. Generally, a plurality of process technologies for advanced semiconductor devices are currently practiced, wherein, for complex circuitry based on field effect transistors, such as microprocessors, storage chips, graphic devices and the like, MOS technology is currently one of the most promising approaches due to the superior characteristics in view of operating speed and/or power consumption and/or cost efficiency. During the fabrication of complex integrated circuits using MOS technology, millions of transistors, i.e., N-channel transistors and/or P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially determines the performance of MOS transistors. Thus, the reduction of the channel length, and associated therewith the reduction of the channel resistivity, may be a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One issue associated with reduced gate lengths is the occurrence of so-called short channel effects, which may result in a reduced controllability of the channel conductivity. Short channel effects may be countered by certain design techniques, some of which, however, may be accompanied by a reduction of the channel conductivity, thereby partially offsetting the advantages obtained by the reduction of critical dimensions.

In view of this situation, it has been proposed to enhance device performance of the transistor elements not only by reducing the transistor dimensions but also by increasing the charge carrier mobility in the channel region for a given channel length, thereby increasing the drive current capability and thus transistor performance. In this manner, performance of sophisticated logic circuitry may be enhanced, for instance, in a microprocessor performance per watt of consumed power may be increased. For example, the lattice structure in the channel region may be modified, for instance, by creating tensile or compressive strain therein, which results in a modified mobility for electrons and holes, respectively. For example, creating tensile strain in the channel region of a silicon layer having a standard crystallographic configuration may increase the mobility of electrons, which, in turn, may directly translate into a corresponding increase of the conductivity of N-type transistors. On the other hand, compressive strain in the channel region may increase the mobility of holes, thereby providing the potential for enhancing the performance of P-type transistors.

One efficient approach in this respect is a technique that enables the creation of desired stress conditions within the channel region of transistor elements by adjusting the stress characteristics of a dielectric layer stack that is formed above the basic transistor structure when the contact level of the device is formed. The contact level, comprised of an interlayer dielectric material and contact elements, may be understood as an interface between the individual semiconductor circuit elements and a complex wiring system or metallization system, in which metal lines and vias may provide the complex network of electrical connections. The dielectric layer stack of the contact level typically comprises one or more dielectric layers which may be located close to the transistor and which may also be used in controlling a respective etch process in order to form contact openings connecting to the gate and drain and source terminals. Therefore, an effective control of mechanical strain in the channel regions, i.e., an effective stress engineering, may be accomplished by adjusting the internal stress of one or more of these layers, which may also be referred to as contact etch stop layers, and by positioning a contact etch stop layer having an internal compressive stress above a P-channel transistor and/or by positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes above the transistor, i.e., above the gate structure and the drain and source regions, wherein, for instance, silicon nitride may be efficiently used due to its high etch selectivity with respect to silicon dioxide, which is a well-established interlayer dielectric material. Furthermore, PECVD silicon nitride may be deposited with a high intrinsic stress, for example, up to 3.6 Giga Pascal (GPa) of compressive stress and up to 1.6 GPa of tensile stress, wherein the type and the magnitude of the intrinsic stress may be efficiently adjusted by selecting appropriate deposition parameters. For example, ion bombardment, deposition pressure, substrate temperature, gas flow rates and the like represent respective parameters that may be controlled for obtaining the desired intrinsic stress.

The resulting strain level in the channel regions of the adjacent transistor elements is determined by the internal stress level of the dielectric materials, the amount of the stressed dielectric material and the effective offset from the channel region. Consequently, for a given device geometry, the strain level in the channel region is typically increased by increasing the internal stress level of the dielectric materials and also increasing the layer thickness of the dielectric materials. During the ongoing scaling of sophisticated semiconductor devices, however, the layer thickness of the stressed dielectric material is limited by the deposition capabilities of the PECVD techniques and the resulting sophisticated surface topography caused by the gate electrode structures of the transistor elements, in particular when densely packed device regions are considered. Furthermore, in some conventional approaches, a so-called "dual stress liner" approach may be applied in which a compressively stressed dielectric material is positioned above the P-channel transistor while a tensile stressed dielectric material is formed above the N-channel transistor, thereby requiring sophisticated masking and patterning regimes, which may also require a reduced layer thickness in order to avoid deposition and patterning related irregularities, such as voids, undue material residues and the like. Consequently, a further increase of transistor performance may critically depend on the internal stress levels of the dielectric materials.

In other cases, the device geometry in densely packed device regions, such as in static RAM areas and the like, may also significantly restrict the gain in performance of a single type of transistors, such as P-channel transistors, since the reduced distance between the transistor elements, i.e., the gate electrode structures thereof, may not allow the deposition of a thick silicon nitride-based dielectric material, without contributing to deposition-related irregularities, which in turn may result in significant yield losses. Thus, also in these cases, the effect of the strain-inducing mechanism obtained by the stressed silicon nitride-based material may become negligible and may therefore require very complex additional strain-inducing mechanisms, for instance based on embedded silicon/germanium alloys and the like.

The present disclosure is directed to various devices and methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques and material systems in which the contact level of the semiconductor devices may receive a superior overall stress level, however, without introducing additional irregularities, which may be accomplished by using material systems providing a very high internal stress level. Consequently, the layer thickness of such material systems may be reduced, thereby enabling the deposition above very sophisticated device geometries substantially without contributing to deposition-related non-uniformities. It has been recognized that a plurality of materials may be deposited with high internal stress levels of approximately 6 GPa and significantly higher, while the intrinsic conductivity of any such materials may be appropriately taken into consideration by appropriately electrically isolating the strain-inducing material. To this end, the strain-inducing material may be patterned so as to receive an opening therein that is substantially aligned to contact openings formed in a later manufacturing stage and respective exposed sidewall areas may be masked by spacer elements. In this manner, the further processing may be continued by forming an interlayer dielectric material and patterning the same on the basis of well-established process techniques, wherein electrical contact of the strain-inducing material and the contact metal may be reliably avoided by the spacer element in combination with additional cap layers. Thus, a high internal stress level may be provided at a reduced layer thickness substantially without affecting the configuration of contact elements, for instance the size and shape thereof.

One illustrative semiconductor device disclosed herein comprises a contact region of a circuit element that is formed in a semiconductor region. The semiconductor device further comprises a material layer stack formed in a portion of the contact region, wherein the material layer stack comprises a first dielectric layer, a strain-inducing non-insulating material layer formed on the first dielectric layer and a second dielectric layer that is formed above the strain-inducing non-insulating material layer. The strain-inducing non-insulating material layer induces a strain in the semiconductor region. Furthermore, the semiconductor device comprises an interlayer dielectric material formed above the contact region and a contact element extending through the interlayer dielectric material and through an opening formed in the material layer stack, wherein the contact element connects to the contact region. Additionally, the semiconductor device comprises a spacer element formed on the sidewalls of the opening so as to laterally isolate the strain-inducing non-insulating material layer.

One illustrative method disclosed herein comprises forming a material layer stack above a semiconductor region of a semiconductor device, wherein the material layer stack comprises a strain-inducing metal-containing material layer formed between a first dielectric layer and a second dielectric layer with respect to a height direction of the layer stack. The method further comprises forming an opening in the material layer stack, wherein the opening extends at least through the strain-inducing metal-containing material layer. The method additionally comprises forming a spacer on inner sidewalls of the opening so as to laterally passivate the strain-inducing metal-containing material layer. Moreover, an inter-layer dielectric material is formed above the material layer stack and in the opening. The method further comprises forming a contact opening so as to extend through the interlayer dielectric material and through the opening and to a contact region formed in the semiconductor region. Finally, the contact opening is filled with a conductive material.

A further illustrative method disclosed herein comprises forming a strain-inducing material layer above a contact region of a transistor of a semiconductor device so as to be electrically insulated from the contact region, wherein the strain-inducing material layer induces strain in a channel region of the transistor. The method further comprises forming an opening through the strain-inducing material layer and forming a spacer element on exposed sidewall surfaces of the strain-inducing material layer in the opening. The method further comprises forming an interlayer dielectric material above the transistor and in the opening. Finally, the method comprises forming a contact element through the interlayer dielectric material so as to connect to the contact region, wherein the contact element extends at least partially through the opening.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to the principles disclosed herein, semiconductor devices, manufacturing techniques and material systems are provided in which the strain-inducing effect induced by a contact level formed above a semiconductor region may be increased by using material layers with a high internal stress level, while an internal conductivity of these materials may not affect the subsequent process sequence for forming contact elements in an interlayer dielectric material. For this purpose, in some illustrative embodiments disclosed herein, the strain-inducing material may be provided within a material layer stack, which may comprise at least one dielectric layer formed below the strain-inducing layer and at least one dielectric material formed above the strain-inducing material layer. Since the strain-inducing material layer may have a high internal stress, for instance approximately 6 GPa and significantly higher, the entire material layer stack may be provided with a reduced thickness compared to conventional stressed silicon nitride-based materials, while, however, nevertheless providing a superior strain-inducing effect. For example, a plurality of metal-containing materials, such as metal nitride materials, such as titanium nitride and the like, may frequently be used during semiconductor production and thus corresponding resources in terms of materials and deposition tools are readily available. Moreover, extremely high internal stress levels may be achieved, for instance up to 9 GPa, for titanium nitride based on available process techniques and recipes, and may thus provide an efficient strain-inducing mechanism, for instance for transistor elements and the like, wherein the encapsulation of the conductive strain-inducing material may nevertheless allow the formation of interlayer dielectric materials and corresponding contact elements with a high degree of compatibility with well-established process strategies. For this purpose, the material layer stack containing the strain-inducing layer may be patterned prior to depositing the interlayer dielectric material and corresponding exposed sidewall areas of the conductive material may be protected by providing spacer elements comprised of any appropriate material so as to also provide superior etch resistivity during the further processing of the device. Consequently, contamination of further dielectric materials to be formed above the circuit elements may be efficiently suppressed so as to not unduly contribute to a reduced dielectric strength of the resulting contact level.

In some illustrative embodiments disclosed herein, superior robustness with respect to misalignments of contact elements may be obtained, without requiring undue increase of an opening formed in the strain-inducing material layer prior to actually depositing the interlayer dielectric material, by using appropriate material systems and process techniques.

Consequently, superior performance of circuit elements, such as transistor elements, may be achieved even for extremely critical surface topographies, as may be encountered in densely packed device regions of sophisticated semiconductor devices. Hence, stress engineering on the basis of a highly stressed contact level may eventually be extended to further device generations including transistor elements having critical dimensions of 40 nm and less.

Figure 1A:
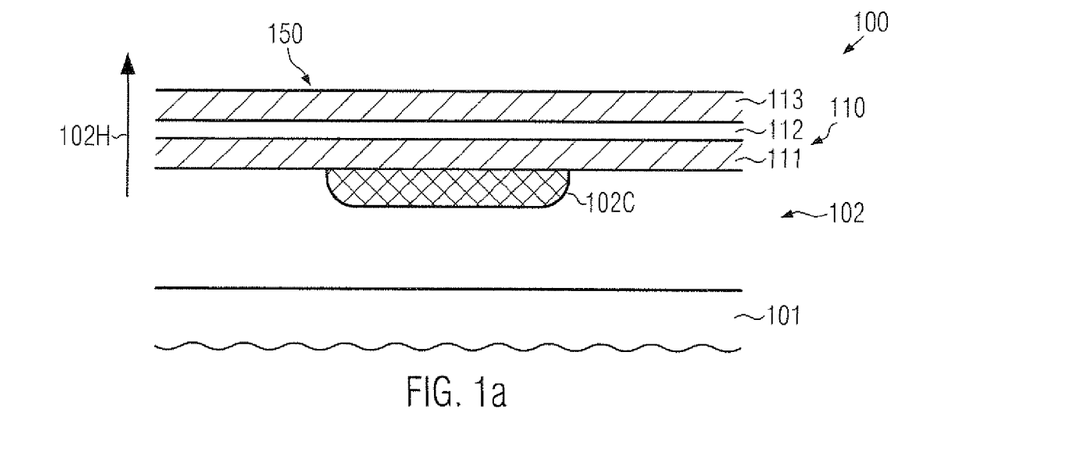
FIGS. 1a-1g schematically illustrate cross-sectional views of a semiconductor device during various manufacturing stages in forming a contact level on the basis of a highly stressed non-insulating material layer that is electrically isolated from a contact element, according to illustrative embodiments.

FIG. 1a schematically illustrates a cross-sectional view of a semiconductor device 100 in an advanced manufacturing stage. The device 100 may comprise a substrate 101, which may represent any appropriate carrier material for providing thereon a semiconductor layer 102. For example, the substrate 101 may represent a semiconductor material, an insulating material and the like. Similarly, the semiconductor layer 102 may represent any appropriate material, such as a silicon-based material, a silicon/germanium material, a silicon/carbon material, any combination of these materials and the like. As previously indicated, typically, silicon-based semiconductor materials may be used for complex integrated devices that are to be formed on the basis of volume production techniques. Furthermore, the charge carrier mobility of silicon-based semiconductor materials may be efficiently increased on the basis of an appropriate strain component, as discussed above. Moreover, in some illustrative embodiments (not shown), the substrate 101 and the semiconductor layer

102 may represent a silicon-on-insulator (SOI) configuration, when a buried insulating layer (not shown) is formed between the substrate 101 and the semiconductor layer 102. In other cases, the semiconductor layer 102 may represent a portion of a crystalline material of the substrate 101, when a "bulk" configuration is considered. Moreover, the semiconductor layer 102 may be appropriate for forming therein and thereabove circuit elements, such as transistors, capacitors, resistors and the like, in accordance with design requirements. For example, a plurality of circuit elements may be formed in and above the semiconductor layer 102, wherein, for convenience, a portion of a circuit element 150 is illustrated so as to not unduly obscure the principles of the present disclosure. For example, an appropriate dopant concentration may be provided within a specific portion of the semiconductor layer 102 as required for the circuit element 150 in order to obtain a desired conductivity type and the like. Moreover, a contact region 102C may be formed in the circuit element 150 and may represent an area which has to be contacted by a contact element in a later manufacturing stage. For example, the contact region 102C may be provided in the form of a metal silicide material and the like, which is frequently used in complex semiconductor devices so as to reduce contact resistivity in silicon-based semiconductor materials. Moreover, a material layer stack 110 is formed above the semiconductor layer 102 and thus above the contact region 102C. The material layer stack 110 may comprise a highly stressed material layer 112 with an internal stress level of approximately 6 GPa and higher in order to induce a desired strain component in the semiconductor layer 102, as discussed above. For example, a plurality of non-insulating materials, such as silicon carbide based materials, diamond-like carbon and, in particular, metal-containing materials, for instance in the form of a metal nitride and the like, may be deposited with a high internal stress level, which may be efficiently transferred into the semiconductor layer 102. For instance, titanium nitride, tantalum nitride and the like may be formed on the basis of well-established deposition recipes, such as sputter deposition, CVD-like deposition techniques and the like, with any appropriate thickness so as to comply with the overall device geometry, as discussed above. For instance, the strain-inducing material layer 112 may be provided with a thickness of several nanometers to approximately 30 nm. Furthermore, the layer stack 110 may comprise a first dielectric layer 111 and second dielectric layer 113 so as to "encapsulate" the layer 112 with respect to a height direction 102H. The dielectric layers 111 and 113 may be provided in the form of any appropriate dielectric material so as to electrically insulate the layer 112 from the semiconductor layer 102 and the contact region 102C. Furthermore, the thickness of the layers 111 and 113 may be selected such that a combined height of the layer stack 110 may result in a surface topography of the device 100 that is compatible with the further processing, i.e., with the deposition of an actual interlayer dielectric material. That is, the layer stack 110, even if provided in densely packed device regions, may result, after deposition in a device topography that may allow the deposition of further materials without introducing deposition-related irregularities, such as voids and the like. For example, a thickness of the first and second dielectric layers 111, 113 may be selected to be approximately 5-30 nm, wherein the thickness may be selected differently for the layers 111 and 113, if desired, as will also be explained later on in more detail. Similarly, the material composition of the layers 111, 113 may be appropriately selected so as to be compatible with the further processing of the device in order to avoid undue exposure of the material 112 to the ambient atmosphere and also suppress any out-diffusion or contamination of other dielectric materials with specific atomic species of the layer 112, such as metal species and the like. In one illustrative embodiment, the dielectric layers 111 and 113 may be comprised of silicon dioxide.

The semiconductor device 100 as illustrated in FIG. 1a may be formed on the basis of the following processes. The one or more circuit elements 150 in the semiconductor layer 102 may be formed on the basis of any appropriate process strategies, for instance, providing isolation structures (not shown) and defining a basic dopant concentration in corresponding semiconductor regions that are laterally delineated by isolation structures. Thereafter, further process steps may be performed, such as forming gate electrode structures, capacitor electrodes and the like, in accordance with the requirements of the device 100. After any high temperature processes, the contact region 102C may be formed, for instance, by the deposition of a refractory metal and initiating a chemical reaction in order to form a metal silicide material. Next, the first dielectric layer 111 may be deposited, for instance, on the contact region 102C, by any appropriate deposition technique, wherein a thickness and material composition may be selected as required. For instance, a plurality of well-established CVD-based techniques are available for forming materials, such as silicon dioxide, silicon nitride, silicon oxynitride and the like. Thereafter, the strain-inducing layer 112, for instance in the form of a metal nitride material, may be deposited by using available deposition techniques, such as CVD-type deposition techniques, physical vapor deposition (PVD) techniques and the like. Thereafter, the dielectric layer 113 may be formed on the layer 112, thereby obtaining a desired confinement of the material 112.

Figure 1B:
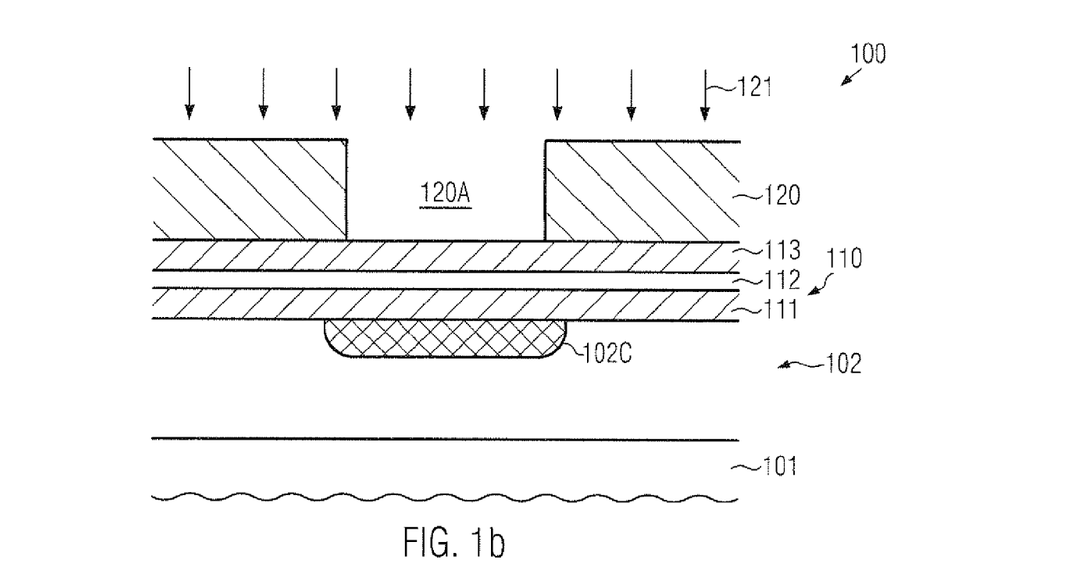

FIG. 1b schematically illustrates the semiconductor device 100 in a manufacturing stage in which an etch mask 120 may be formed above the material layer stack 110 and may comprise an opening 120A, which is generally aligned to the contact region 102C. That is, the opening 120A may basically correspond to the lateral direction of a contact element to be formed in a later manufacturing stage, wherein a lateral size of the opening 120A may be selected to be greater than a lateral size of a contact element still to be formed. It should be appreciated in this respect that a lateral direction is to be understood as any direction that is perpendicular to the height direction 102H of FIG. 1A.

The etch mask 120 may be formed on the basis of lithography techniques, for instance, in the form of a resist material, which may be patterned so as to obtain the opening 120A with the desired dimensions and position. Thereafter, the device 100 may be exposed to a reactive etch ambient 121, in which at least the materials 113 and 112 may be patterned on the basis of the mask 120. For example, the etch ambient 121 may be established as a plasma atmosphere based on appropriate reactive components in order to etch through the layer 113. For example, a plurality of plasma-assisted etch recipes are available for etching dielectric materials, such as silicon dioxide, silicon nitride and the like. Consequently, during a first phase of the etch process 121, the exposed portion of the material 113 may be removed, wherein the layer 112 may act as an etch stop material, depending on the etch chemistry used. Thereafter, in a further phase of the etch process 121, which may be performed in the same process chamber or in a different process chamber, the etch chemistry may be appropriately selected so as to etch through the material 112, wherein the etch process may be stopped on or in the first dielectric layer 111. It should be appreciated that a plurality of well-established etch recipes are available for etching through conductive material, such as metal nitride materials, carbon materials and the like, and any of these etch recipes may be applied during the etch process or sequence 121.

Figure 1C:
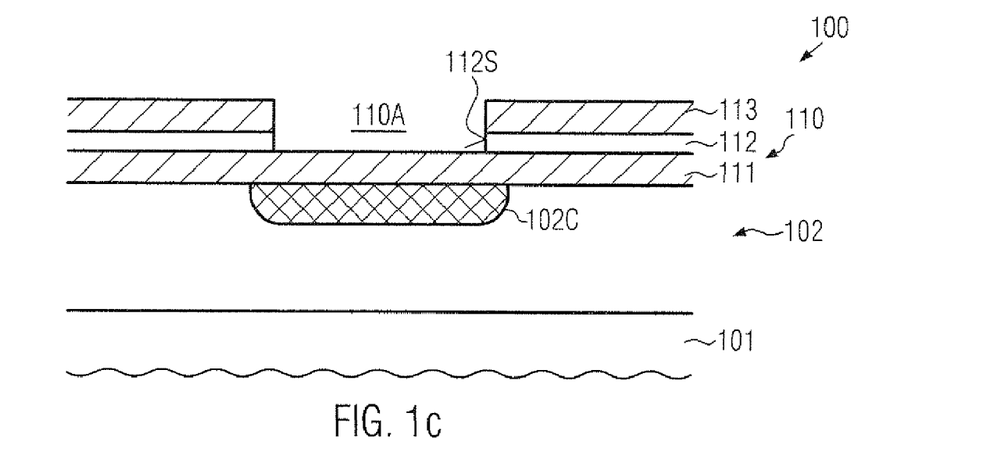

FIG. 1c schematically illustrates the semiconductor device 100 in a further advanced manufacturing stage in which an opening 110A is formed in the material layer stack 110. In the embodiment shown, the opening 110A may extend through the layers 113 and 112 and may terminate on or in the layer 111, depending on the characteristics of the preceding etch sequence. Thus, the opening 110A may substantially correspond to the lateral position of a contact element still to be formed, while the lateral size of the opening 110A may be selected so as to substantially correspond to the size of the contact element or may be selected to be greater, wherein, however, nevertheless, undue removal of the material 112 may be avoided in order to not unduly affect the overall strain-inducing efficiency. For example, in some illustrative embodiments, the lateral size of the opening 110A may be equal to or at most approximately 10% greater than a corresponding lateral size of a contact element still to be formed. Thus, within the opening 110A, sidewall surfaces 112S of the material 112 may be exposed.

Figure 1D:
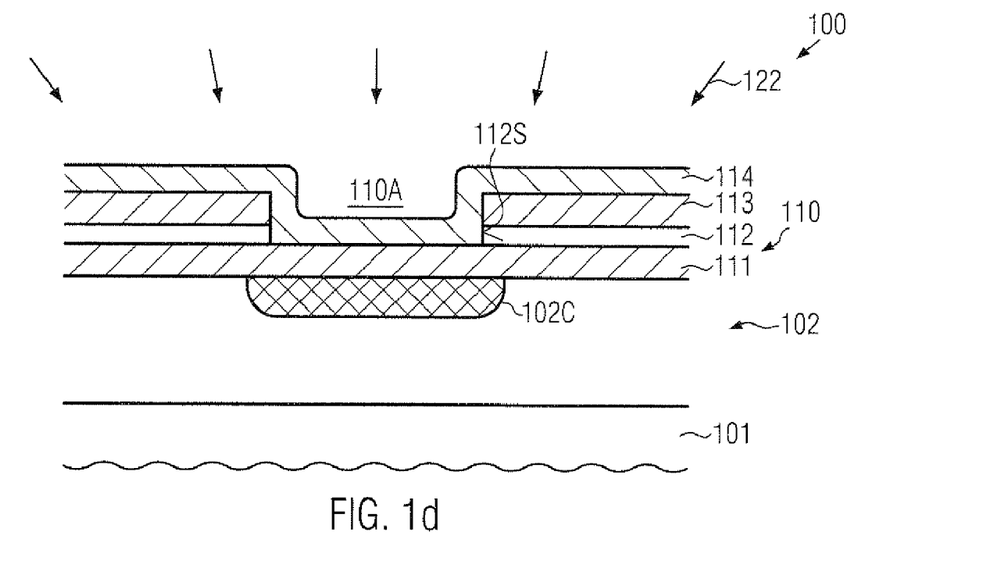

FIG. 1d schematically illustrates the semiconductor device 100 in a manufacturing phase when a deposition process 122 may be performed to form a spacer layer 114 above the layer stack 110 and within the opening 110A. The spacer layer 114 may be comprised of any appropriate dielectric material, such as silicon dioxide, silicon nitride and the like, depending on the requirements for the further processing of the device 100. In some illustrative embodiments, the spacer layer 114 may be provided as a material having substantially the same composition as one or both of the dielectric layers 111, 113. For instance, a silicon dioxide material may be used. Furthermore, a thickness of the layer 114 may be selected such that a desired width of spacer elements may be obtained within the opening 110A in order to provide the desired passivation of the sidewall surfaces 112S.

Figure 1E:
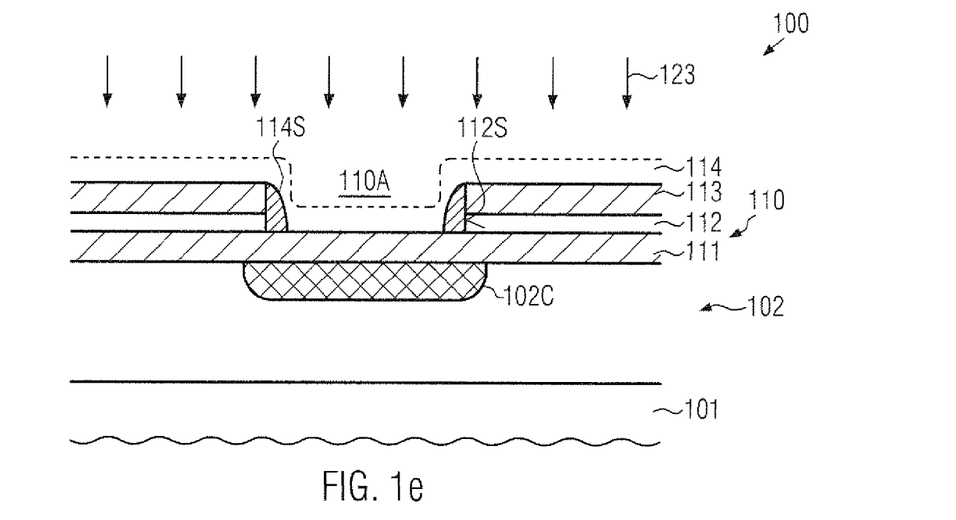

FIG. 1e schematically illustrates the semiconductor device 100 when exposed to a reactive etch process 123, which may be performed as a plasma-assisted anisotropic etch process. During the etch process 123, material of the layer 114 may be removed, which may be accomplished on the basis of well-established anisotropic etch recipes. Consequently, a spacer element 114S may be formed on inner sidewalls of the opening 110A, thereby reliably covering the sidewall surfaces 112S. It should be appreciated that a width of the spacer element 114S may depend on the thickness of the layer 114 and on the process conditions during the etch process 123. For example, the etch process 123 may be performed so as to substantially completely remove the spacer layer 114 from above the material stack 110, which may be accomplished on the basis of a time-controlled etch process. For this purpose, the removal rate for the material 114 may be determined in advance and, based on a desired initial thickness, an appropriate etch time may be determined. It should be appreciated, however, that any material erosion of the layers 112 and 111 may be less critical, as long as a reliable confinement of the material of the layer 112 may be ensured. For example, a thickness of the layers 111 and 113 may be selected such that a certain degree of material erosion may not result in the exposure of the material 112 and, if desired, in the exposure of the contact region 102C.

Consequently, after the etch process 123, material of the layer 112 may be efficiently confined or passivated by means of the layers 112 and 111 and the spacer element 114S. Consequently, during the further processing, for instance during any cleaning processes and the like, if required, and in particular during the deposition of any further materials, an interaction of the material of the layer 112 with corresponding process environments may be substantially suppressed.

Figure 1F:
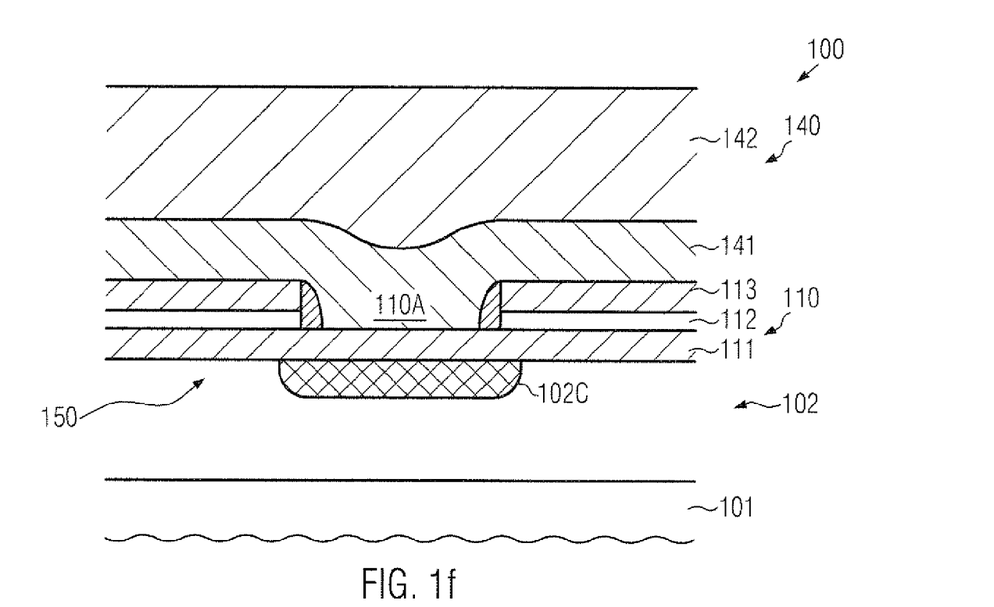

FIG. 1f schematically illustrates the semiconductor device 100 in a further advanced manufacturing stage, in which an interlayer dielectric material 140 may be formed above the layer stack 110 and within the opening 110A. In the embodiment shown in FIG. 1f, the interlayer dielectric material 140 may comprise two or more different materials, such as a etch stop layer 141, which may also be referred to as a contact etch stop layer, followed by one or more "actual" interlayer dielectric materials, for instance, in the form of silicon dioxide and the like. The interlayer dielectric material 140 may be formed on the basis of any appropriate process technique, wherein, as previously discussed, the layer 141 may be formed on the basis of an appropriate layer thickness so as to substantially avoid deposition-related irregularities while nevertheless providing the desired etch stop capabilities. Similarly, the material 142 may be deposited on the basis of any appropriate process technique. It should be appreciated that, in some cases, the material 141 may be provided as a stressed dielectric material, for instance in the form of silicon nitride, having a desired internal stress level so as to further enhance performance of the circuit element 150. However, as previously discussed, the corresponding material characteristics may be selected so that the gap fill capabilities may be achieved as required for avoiding any undue irregularities. In other cases, the material 141 may be provided as a substantially stress-neutral material and the thickness and material composition may be selected in view of providing the required etch stop capabilities for patterning the interlayer dielectric material 140. It should further be appreciated that, due to the provision of the material layer stack 110 with the encapsulated layer 112, a high degree of compatibility with conventional strategies may be achieved, if desired, for forming the interlayer dielectric material 140, while at the same time providing a very efficient strain-inducing mechanism. It should be appreciated that, after deposition of the material 142, a planarization process may be performed in order to obtain a substantially planar surface, since a moderately pronounced surface topography may be obtained, for instance caused by circuit elements such as gate electrode structures, capacitor electrodes, resistors and the like, as will be described later on in more detail.

Figure 1G:
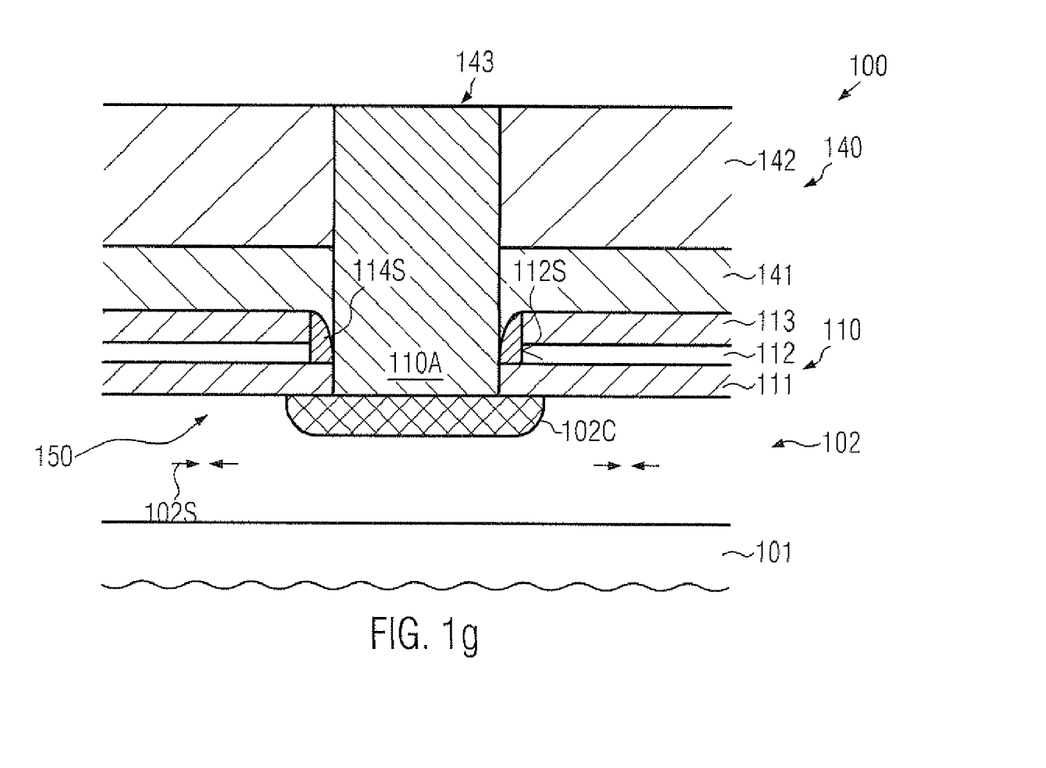

FIG. 1g schematically illustrates the semiconductor device 100 in a further advanced manufacturing stage in which a contact element 143 may be formed in the interlayer dielectric material 140 and may extend through the material layer stack 110 so as to connect to the contact region 102C. The contact element 143 may comprise any appropriate conductive material, such as tungsten, aluminum, copper and the like, possibly in combination with an appropriate conductive barrier material (not shown), as required. The contact element 143 may be formed on the basis of any appropriate process technique, for instance, forming a contact opening in the interlayer dielectric material 140, which may be accomplished by providing an appropriate etch mask, such as a resist material, possibly in combination with a hard mask material, and etching through the material 142 on the basis of appropriate anisotropic etch techniques. During this etch process, the material 141 may act as an etch stop layer, since frequently significant different height levels may occur in the device 100, thereby requiring an efficient etch control in areas having a reduced thickness of the material 142, while in other cases, as shown in FIG. 1g, the etch process may further advance due to the increased thickness of the material 142. As previously indicated, a plurality of selective etch recipes are available for etching silicon dioxide material selectively with respect to silicon nitride material. Thereafter, the etch chemistry may be appropriately adapted to etch through the material 141, wherein this etch process may advance within the opening 110A, thereby exposing the dielectric layer 111. Subsequently, the etch process may be continued, for instance, on the basis of a different etch chemistry, if required, or based on the same etch chemistry in order to etch through the layer 111 and through or into the contact region 102C. During the entire etch process, the spacer 114S may reliably preserve integrity of the material 112, due to the anisotropic nature of the etch process. Moreover, in some illustrative embodiments, as previously discussed, the lateral dimension of the contact element 143 may be less compared to the lateral dimensions of the opening 110A, thereby also providing a certain process margin when etching through the material 141 within the opening 110A and finally exposing the contact region 102C. Thereafter, a desired conductive material may be filled in, for instance, by CVD-type deposition techniques, electrochemical deposition techniques and the like, and any excess material may be removed by chemical mechanical polishing (CMP), etch process and the like.

Consequently, the contact element 143 may reliably connect to the contact region 102C without contacting the material layer 112, which in turn may induce a desired strain component 102S in the semiconductor layer 102. For example, a moderately high compressive strain may be obtained on the basis of a titanium nitride material, which may be advantageous in enhancing the mobility of holes in the semiconductor layer 102.

Figure 1H:
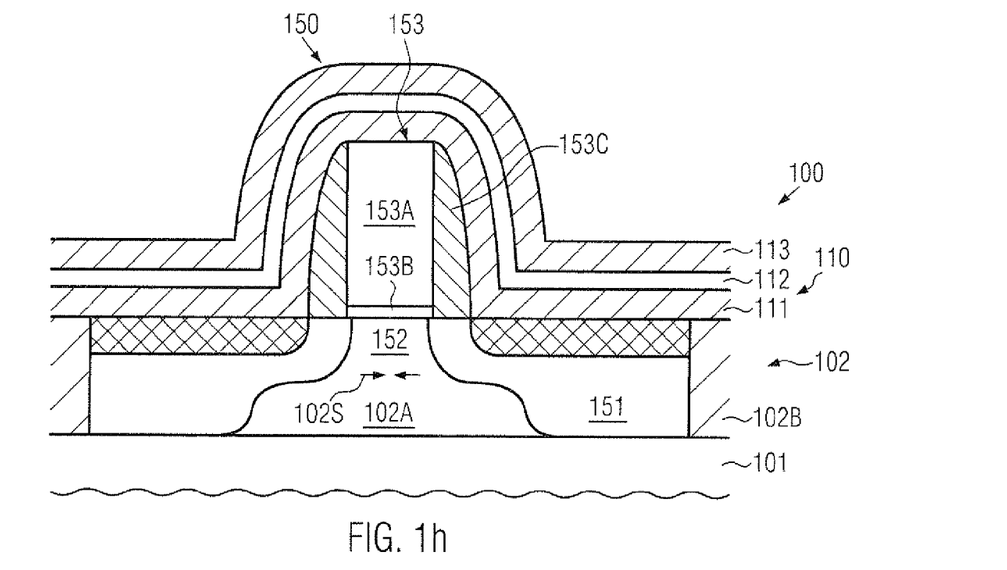
FIGS. 1h-1i schematically illustrate cross-sectional views of the semiconductor device according to further illustrative embodiments in which the contact level is formed adjacent to and above a transistor element.
Figure 1I:
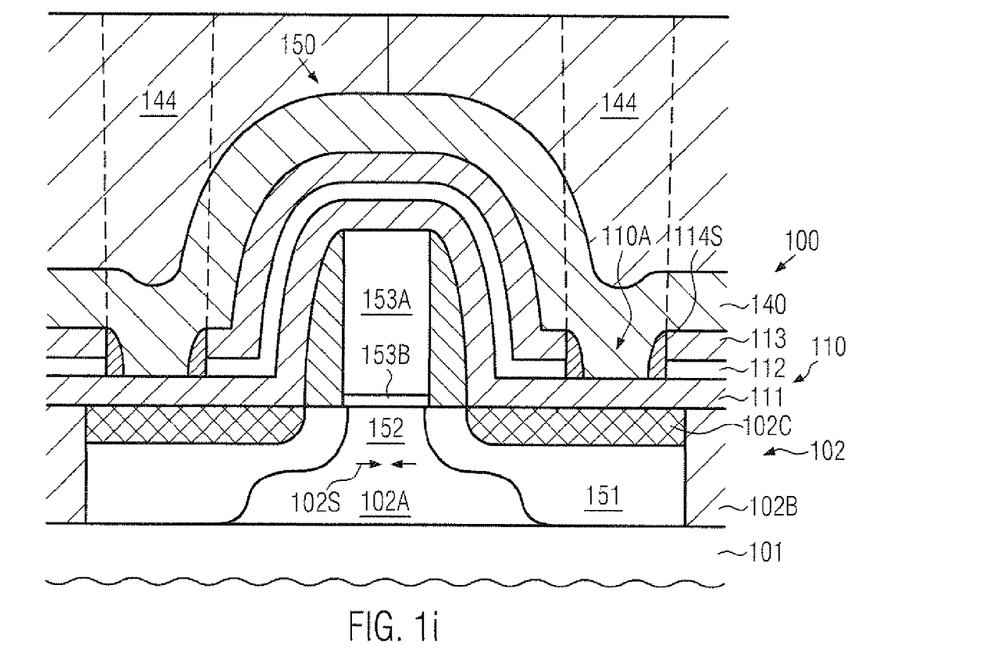

With reference to FIGS. 1h-1i, further illustrative embodiments will now be described, in which the circuit element may be provided in the form of a transistor.

FIG. 1h schematically illustrates the semiconductor device 100 in a manufacturing stage in which the circuit element 150 may represent a field effect transistor in an advanced manufacturing stage. As illustrated, the transistor 150 may comprise drain and source regions 151 formed in an active region 102A, i.e., in a portion of the semiconductor layer 102 having an appropriate lateral size and conductivity type. For example, the active region 102A may be laterally delineated by an isolation structure 102B, such as a shallow trench isolation. Moreover, the drain and source regions 151 may comprise the contact region 102C in the form of a metal silicide material, as is also previously explained. Furthermore, a gate electrode structure 153 may be formed on the active region 102A and may comprise an electrode material 153A and a gate dielectric material 153B, which separates the electrode material 153A from a channel region 152. Moreover, the gate electrode structure 153 may comprise a spacer structure 153C. The gate electrode structure 153 may have any appropriate configuration in order to comply with the overall requirements for the device 100. For example, the gate dielectric material 153B may comprise a high-k dielectric material, which is to be understood as a dielectric material having a dielectric constant of 10.0 or higher. Moreover, the electrode material 153A may be provided in the form of any appropriate conductive material, such as a semiconductor material, a metal, metal-nitride and the like. As previously explained, the transistor 150 may represent a sophisticated circuit element having a critical dimension, i.e., a gate length, which is to be understood as the horizontal extension of the electrode material 153A in FIG. 1H, of approximately 40 nm and less.

The transistor element 150 as illustrated in FIG. 1h may be formed on the basis of any appropriate process technique wherein, as shown, the gate electrode structure 153 may contribute to a pronounced surface topography of the device 100. It should be appreciated that a plurality of gate electrode structures 153 may be formed in close proximity to each other in densely packed device areas, thereby contributing to sophisticated conditions for the deposition of any further materials. Furthermore, the material layer stack including the strain-inducing layer 112 may be formed above the transistor 150 and may have an appropriate configuration in terms of internal stress level and overall thickness so as to comply with the surface topography of the device 100. With respect to any manufacturing techniques for forming the layer stack 110, it may be referred to any embodiments described above. Hence, an appropriate strain level 102S may be obtained in the channel region 152 on the basis of the material layer stack 110, without contributing to deposition-related irregularities.

FIG. 1i schematically illustrates the semiconductor device 100 in a further advanced manufacturing stage. As illustrated, the interlayer dielectric material 140 may be provided above the transistor 150 in a planarized configuration and may also be formed in the openings 110A that are provided in the material layer stack 110. Moreover, in this manufacturing stage, sidewall spacers 114S may be provided within the openings 110A, as is also previously explained. Hence, in this manufacturing stage, contact openings 144 may be formed through the interlayer dielectric material 140 so as to extend through the openings 110A, which may be accomplished on the basis of a process sequence as described above. Furthermore, in a further advanced stage, the contact openings 144 may also be formed so as to extend through the layer 111 and to connect to the contact regions 102C. Hence, contact elements may also be formed for complex device geometries on the basis of the material stack 110, wherein depositing the interlayer dielectric material 140 and patterning the same may not be substantially affected by the layer 112 in terms of isolation and/or process complexity.

With reference to FIGS. 1j-1o, further illustrative embodiments will now be described in which enhanced robustness with respect to contact misalignments may be achieved.

Figure 1J:
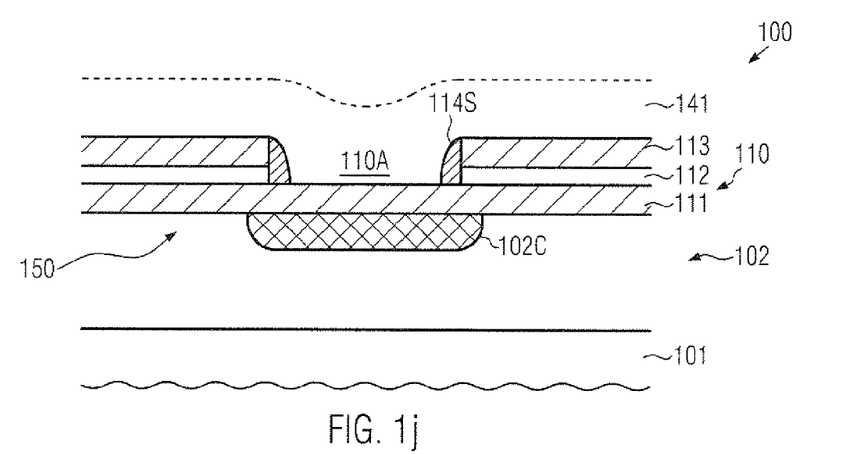
FIGS. 1j-1o schematically illustrate cross-sectional views of the semiconductor device during various manufacturing stages in imparting superior robustness with respect to misalignments to the non-insulating strain-inducing material without requiring modifications of contact elements, according to still further illustrative embodiments.

FIG. 1j schematically illustrates the semiconductor device 100 in a manufacturing stage in which the material layer stack 110 is formed above the semiconductor layer 102 and comprises the opening 110A. In the embodiment shown, the opening 110A may extend to the contact region 102C and may thus expose a portion thereof. For this purpose, the corresponding etch process for patterning the material layer stack 110 may be performed so as to etch through the layers 113, 112 and 111 while using the contact region 102C as an efficient etch stop material. Thereafter, the spacer material may be deposited and may be etched so as to obtain the spacer element 114S as illustrated in FIG. 1j.

Figure 1K:
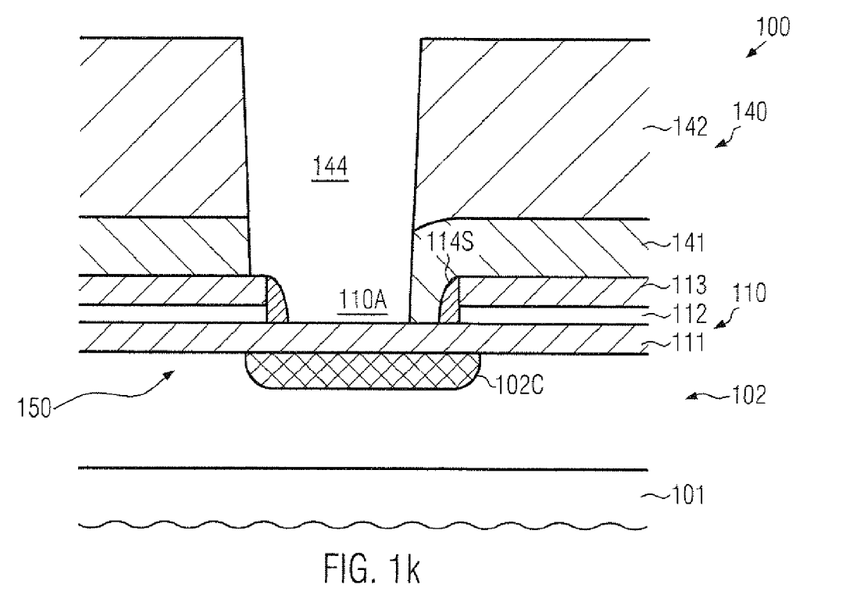

FIG. 1k schematically illustrates the semiconductor device 100 in a further advanced manufacturing stage. As shown, the interlayer dielectric material 140 may be provided and may have formed therein the contact opening 144, which may extend to the contact region 102C. To this end, an etch process may be performed so as to etch through the material 142 while using the material 141 as an efficient etch stop material, as is also previously explained. Thereafter, a further etch process may be performed so as to etch through the material 141, which may be accomplished on the basis of an etch chemistry that may have a moderately high selectivity with respect to the materials of the layers 113 and at least of the spacer element 114S. In this case, even a significant misalignment of the contact opening 144 with respect to the opening 110A may not result in an exposure of the material 112, thereby avoiding an unwanted reaction between a conductive fill material to be filled into the contact opening 144 and the layer 112. Consequently, the lateral dimensions of the opening 110A may be selected so as to not unduly consume material of the layer 112, while also providing sufficient process margins for positioning the contact opening 144.

Figure 1L:
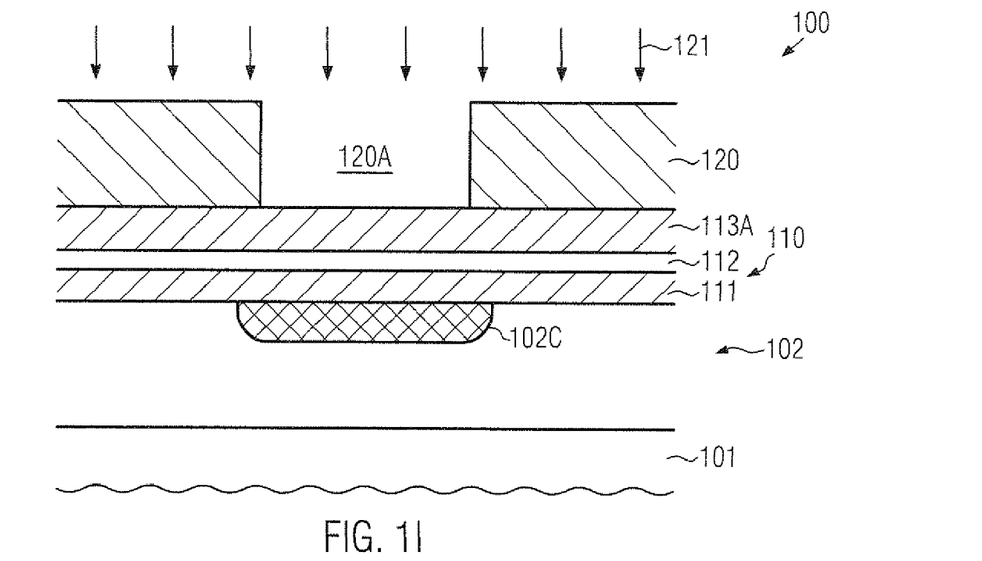

FIG. 1*l* schematically illustrates the semiconductor device 100 according to further illustrative embodiments in which the layer stack 110 may comprise a dielectric layer 113A of increased thickness formed above the strain-inducing layer 112. Moreover, the etch mask 120 may be provided so as to expose a desired portion of the layer stack 110, as is also previously discussed with reference to FIG. 1*b*. Consequently, the device 100 may be subjected to the etch process 121 for patterning the layer stack 110, however, without exposing the contact region 102C. That is, during the etch process 121, the exposed portion of the layer 113A and the exposed portion of the layer 112 may be removed.

Figure 1M:
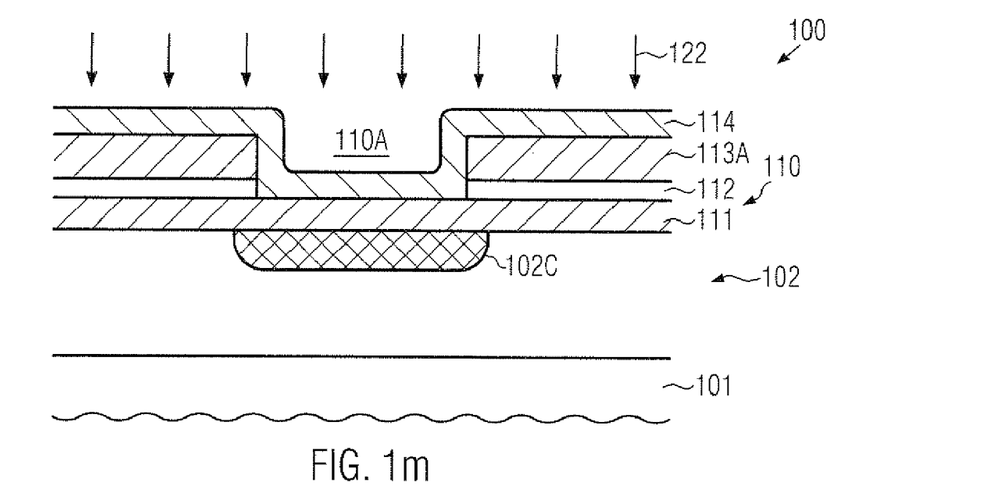

FIG. 1*m* schematically illustrates the semiconductor device 100 in a further advanced manufacturing stage in which the semiconductor layer 114 may be deposited during the process 122 above the layer 113A and within the opening 110A. With respect to a thickness of the layer 114, the same criterion may apply as previously explained.

Figure 1N:
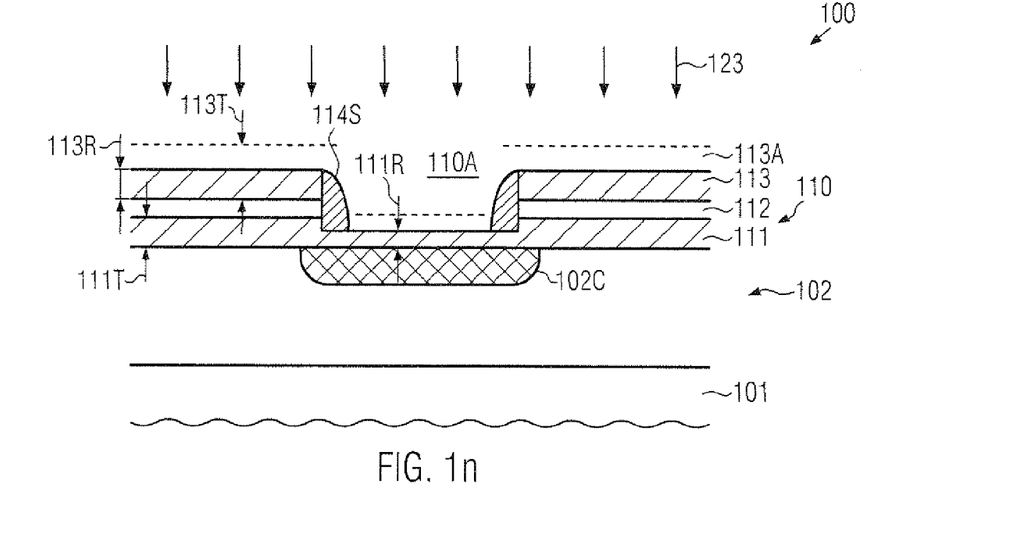

FIG. 1*n* schematically illustrates the semiconductor device 100 during the spacer etch process 123, in which the sidewall spacers 114S may be formed within the opening 110A. Moreover, the etch process 123 may be performed for an increased time interval so as to also remove a portion of the layer 111, thereby reducing a thickness thereof from the initial thickness 111T to a desired reduced thickness 111R. Similarly, the initial layer 113A may also be reduced in thickness during the etch process 123, starting from an initial thickness 113T, in order to obtain the dielectric layer 113 of thickness 113R, which may be appropriate for preserving integrity of the layer 112 during the further processing. Consequently, upon providing the layer 113A with the increased thickness 113T, a significant amount of the layer 111 may be removed within the opening 110A, however, without completely exposing the contact region 102C. In this case, the further processing may be continued by depositing the interlayer dielectric material, as previously discussed, and patterning the same, wherein the material 111 having the reduced thickness 111R may still cover the contact region 102C. Upon etching through the contact etch stop layer 141 (FIG. 1*k* in a final phase), the remaining portion of the layer 111 also has to be removed, which, however, may also result in a certain material erosion of the spacer element 114S and of the layer 113, if a pronounced degree of misalignment may have occurred, as is for instance shown in FIG. 1*k*. Due to the reduced thickness 111R, a corresponding exposure to an etch ambient may, however, be less pronounced and may thus still preserve a sufficient amount of materials of the spacers 114S and of the layer 113 in order to preserve integrity of the layer 112. Consequently, also in this case, a superior robustness with respect to misalignments of contact elements with respect to the opening 110A may be accomplished, however, without unduly exposing the contact region 102C during the further processing, if a corresponding exposure is considered inappropriate.

Figure 1O:
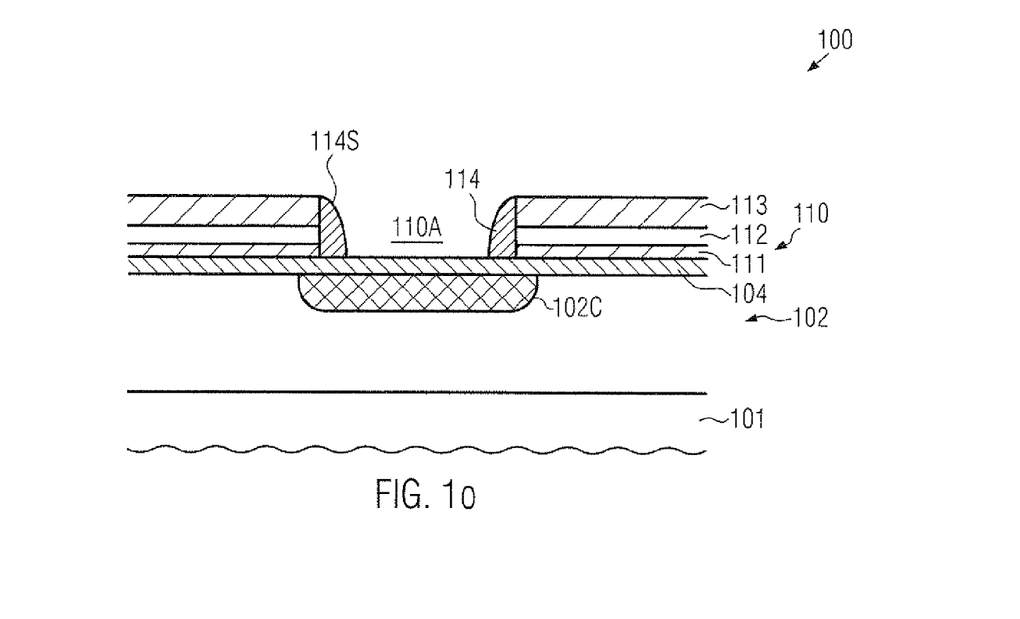

FIG. 1*o* schematically illustrates the semiconductor device 100 according to further illustrative embodiments in which the layer stack 110 may be formed above an additional etch stop liner 104, which may have a different material composition compared to the layer 111. For example, the layer 111 may be comprised of silicon dioxide, while the etch stop liner 104 may be comprised of silicon nitride. It should be appreciated that, seen from another point of view, the etch stop liner 104 may also be considered as a part of the material layer stack 110.

The etch stop liner 104 may be formed on the basis of any appropriate deposition technique and may preferably be made of a material having a similar etch rate compared to a portion of the interlayer dielectric material still to be formed. For example, as explained above, typically, contact etch stop layers, such as the layer 141 (FIG. 1*k*) may be comprised of silicon nitride, which may have to be etched so as to expose the contact region 102C in a final phase of the patterning process for providing a contact opening. Consequently, by providing the etch stop liner 104 so as to have similar etch characteristics, the liner 104 may also be removed during this final phase of the etch process. Thereafter, the layer stack 110 may be formed, as previously discussed, and subsequently the opening 110A may be patterned, wherein the etch stop liner 104 may act as an efficient etch stop material, for instance when etching the layer 111. Thereafter, the spacer element 114 may be formed, as previously discussed, i.e., by depositing a spacer layer and etching the same on the basis of an anisotropic etch recipe, wherein the liner 104 may also act as an efficient etch stop material, thereby avoiding undue exposure of the contact region 102C. Thereafter, the further processing may be continued, as described above, i.e., the interlayer dielectric material may be deposited and may be patterned so as to form a contact opening. Thus, during the final phase, the etch stop liner 104 may also be removed, while the spacer 114, the layer 111 and the layer 113 may preserve integrity of the material 112, even if a pronounced misalignment may occur so that exposure to the etch atmosphere upon exposing the contact region 102C may not unduly affect the material 112.

As a result, the present disclosure provides semiconductor devices and manufacturing techniques in which highly stressed materials, such as metal nitrides, or any other conductive materials, may be provided in the contact level of sophisticated semiconductor devices, wherein electrical and chemical integrity of the strain-inducing material may be preserved by forming a material layer stack and patterning the same prior to depositing the actual interlayer dielectric material. During the patterning of the material layer stack, the exposed sidewall surface areas may be masked on the basis of spacer elements. Consequently, high strain levels may be induced in the semiconductor region, while nevertheless a reduced overall layer thickness of the strain-inducing material may provide superior deposition conditions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a material layer stack above a semiconductor region of a semiconductor device, said material layer stack comprising a strain-inducing metal-containing material layer formed between a first dielectric layer and a second dielectric layer with respect to a height direction;
   forming an opening in said material layer stack, said opening extending at least through said strain-inducing metal-containing material layer;

forming a spacer element on inner sidewalls of said opening so as to laterally passivate said strain-inducing metal-containing material layer;

forming an interlayer dielectric material above said material layer stack and in said opening;

forming a contact opening so as to extend through said interlayer dielectric material and said opening and to a contact region formed in said semiconductor region; and filling said contact opening with a conductive material.

2. The method of claim 1, wherein forming said opening in said material layer stack comprises etching through said second dielectric layer and said strain-inducing metal-containing layer and preserving at least a portion of said first dielectric layer in said opening.

3. The method of claim 2, wherein forming said spacer element comprises depositing a dielectric material and performing an etch process.

4. The method of claim 3, wherein performing said etch process comprises etching through said dielectric material and removing a portion of said first dielectric layer in said opening without exposing said contact region.

5. The method of claim 1, wherein forming said opening comprises exposing said contact region.

6. The method of claim 1, further comprising forming an etch stop layer on said contact region prior to forming said material layer stack and using said etch stop layer as an etch stop when forming said opening in said material layer stack.

7. The method of claim 6, wherein said etch stop layer is formed so as to have a similar etch rate compared to a contact etch stop layer provided in said interlayer dielectric material.

8. The method of claim 1, wherein said strain-inducing metal-containing material layer is a metal nitride material.

9. The method of claim 8, wherein said strain-inducing metal-containing material layer has an internal stress level of approximately 6 GPa or higher.

10. A method, comprising:

forming a strain-inducing material layer above a contact region of a transistor of a semiconductor device so as to be electrically insulated from said contact region, said strain-inducing material layer inducing strain in a channel region of said transistor;

forming an opening through said strain-inducing material layer;

forming a spacer element on exposed sidewall surfaces of said strain-inducing material layer in said opening;

forming an interlayer dielectric material above said transistor and in said opening; and forming a contact element through said interlayer dielectric material so as to connect to said contact region, said contact element extending at least partially through said opening.

11. The method of claim 10, wherein said strain-inducing material layer is formed so as to comprise a metal species.

12. The method of claim 11, wherein said strain-inducing material layer is formed as a metal nitride layer.

13. The method of claim 10, wherein forming said strain-inducing material layer comprises forming a first dielectric layer above said transistor, forming a non-insulating material on said first dielectric layer and forming a second dielectric layer on said non-insulating material.

14. The method of claim 13, wherein forming said opening comprises etching thorough said second dielectric layer and said non-insulating material.

15. The method of claim 14, wherein forming said opening further comprises preserving at least a portion of said first dielectric layer in said opening so as to avoid exposure of said contact region.

* * * * *